United States Patent
Kovacic et al.

(10) Patent No.: US 6,346,453 B1
(45) Date of Patent: Feb. 12, 2002

(54) METHOD OF PRODUCING A SI-GE BASE HETEROJUNCTION BIPOLAR DEVICE

(75) Inventors: Stephen J. Kovacic, Kanata; Derek C. Houghton, Gloucester, both of (CA)

(73) Assignee: SiGe Microsystems Inc., Ottawa (CA)

( * ) Notice: Subject to any disclaimer, the term of this patent is extended or adjusted under 35 U.S.C. 154(b) by 0 days.

(21) Appl. No.: 09/492,463

(22) Filed: Jan. 27, 2000

(51) Int. Cl.⁷ .............................................. H01L 21/331
(52) U.S. Cl. ...................... 438/312; 438/309; 438/343
(58) Field of Search ................................. 438/312, 343, 438/309, 317, 321, 349; 257/197, 198, 200

(56) References Cited

U.S. PATENT DOCUMENTS

| 5,118,634 A | * | 6/1992 | Neudeck et al. | |
|---|---|---|---|---|
| 5,250,448 A | * | 10/1993 | Hamasaki et al. | |
| 5,399,511 A | * | 3/1995 | Taka et al. | |
| 5,494,836 A | * | 2/1996 | Imai | |
| 5,846,867 A | * | 12/1998 | Gomi et al. | 438/318 |
| 5,930,635 A | * | 7/1999 | Bashir et al. | 438/313 |
| 6,020,246 A | * | 2/2000 | Koscielniak et al. | 438/341 |
| 6,143,362 A | * | 11/2000 | Sandhu et al. | 427/255.391 |

\* cited by examiner

*Primary Examiner*—Trung Dang
(74) *Attorney, Agent, or Firm*—Freedman & Associates

(57) ABSTRACT

A method of producing a bipolar transistor includes the step of providing a sacrificial mesa over a layer of SiGe in order to prevent a polysilicon covering layer from forming over a predetermined region of the SiGe layer forming the transistor base. After an etching process removes the sacrificial mesa and the SiGe layer is exposed, an oppositely doped material is applied over top of the SiGe layer to form an emitter. This makes it possible to realize a thin layer of silicon germanium to serve as the transistor base. This method prevents the base layer SiGe from being affected, as it otherwise would be using a conventional double-poly process.

12 Claims, 14 Drawing Sheets

(PRIOR ART)

METHOD OF PRODUCING A SI-GE BASE HETEROJUNCTION BIPOLAR DEVICE

FIELD OF THE INVENTION

The present invention relates generally to a method of producing a heterojunction bipolar semiconductor device, and in a particular embodiment, a bipolar transistor and also to a method of producing a semiconductor device including a bipolar transistor having a SiGe base supported by an oppositely doped substrate.

BACKGROUND OF THE INVENTION

To improve the operating speed of a bipolar transistor, it is important that the base layer be thin enough to minimize the time it takes electronic charges to move from the emitter to the collector, thereby minimizing the response time of the transistor, and have a high concentration of dopant in order to minimize base resistance. Typically, ion implantation technique is widely used to form a base layer. However, this technique has a problem of ion channeling, which limits the minimum thickness of the base layer to about 40 nm. Another disadvantage of ion implantation is that the Si/SiGe film is often damaged by the ions, and high temperature annealing is required which alters the concentration profile within the various layers of semiconductor material making up the transistor.

One known technique to avoid the above problem is to form a base layer using an epitaxial technique which precisely defines the base region and inherently has no problem of channelling because the dopants are placed in the semiconductor layer during growth. With this technique, it is possible to form a base layer having a thickness smaller than 30 nm and having an arbitrary impurity concentration or profile by incorporating an impurity directly into the base layer during the epitaxial growth process. Using this technique, a high-speed bipolar transistor having a maximum cut-off frequency $f_T$ as high as 50 GHz has been realized.

Although the bipolar transistor fabricated with the above technique has such a high maximum cut-off frequency $f_T$ as a result of the thin base, the engineering trade-off is high base resistance ($R_b$) which may limit the maximum frequency of oscillation $f_{max}$ to 30–40 GHz.

To further increase the impurity concentration of the base layer to reduce the base resistance ($R_b$), it is required to increase not only the impurity concentration of the base layer but also that of the emitter layer so that a sufficiently high current gain (hFE) can be obtained.

However, the further increase in the impurity concentration of the emitter can cause a reduction in bandgap which in turn results in a reduction in the injection efficiency, a reduction in the emitter-base breakdown voltage, and an increase in the emitter-base junction charging time constant $\tau_{EB}$. Since the requirements among these parameters conflict with each other, there is a limitation in the improvement in the operating speed.

Notwithstanding, this conflict can be avoided by employing a heterojunction between the emitter and base in which the bandgap of the emitter is different from that of the base. For example, silicon germanium (SiGe) having a narrower bandgap than silicon is used as a base material so as to form a practical heterojunction. In the heterojunction structure, the emitter can inject charge carriers with greater efficiency into the base than the emitter of the homogeneous junction structure. This makes it possible to achieve a sufficiently high current gain without increasing either the base resistance ($R_b$) or the emitter-base junction charging time constant $\tau_{EB}$, and thus it is possible to realize a high-speed bipolar transistor having a maximum frequency of oscillation $f_{max}$ as high as about 100 GHz.

To fabricate a heterojunction bipolar transistor, it is important to control the distributions of p-type impurity and germanium (Ge) across the base layer so that the Ge profile is formed at a precise location with respect to the p-n junction. As was stated earlier, transistor performance is greatly affected by the incorporation of Ge and the concentration profiles of the dopants. Moreover, the interaction of bandgap profile with the dopant profile is also an important factor in the overall design of the transistor and the performance. If the location of the Ge profile—that is, the concentration of Ge versus position with respect to the dopant position is not controlled precisely from wafer to wafer, or from manufacturing lot to manufacturing lot, or even across the wafer, then transistor performance will vary accordingly. In one area of the wafer, for example, transistors with excellent high-frequency response may be realized while at a different location, poor high-frequency response might be seen. Correspondingly, these differences in transistor performance may result in poor circuit yield, and increased circuit testing costs.

With reference to FIGS. 1A–1C, a conventional method of producing a junction bipolar transistor is described below.

As shown in FIG. 1A, an n⁺ buried collector layer 112 is formed on the surface of a silicon substrate 111 by means of solid-state diffusion or ion-implantation. An epitaxial layer 113 with an impurity concentration of $5 \times 10^{16}$ atoms/cm³ is then epitaxially grown thereon by means of an epitaxial growth technique. The epitaxial layer 113 is locally oxidized (for example by the LOCOS (local oxidation of silicon) method so as to form a device isolation oxide film 14. The surfaces of the epitaxial layer 113 and the device isolation oxide film 114 can be planarized. In addition, an ion implantation process is then performed either before oxidation or after so that a p⁺ device isolation diffusion layer 115 is formed under the device isolation oxide film 114. Another ion implantation process is performed to form an n⁺ collector contact diffusion layer 116 connected to the n⁺ buried collector layer 112.

Then as shown in FIG. 1B, a 30 nm thick silicon germanium ($Si_{0.8}Ge_{0.2}$) film containing boron (B) acting as a p-type impurity with a concentration of about $3 \times 10^{19}$ atoms/cm³ is formed over the entire surface area of the epitaxial layer 113.

A 50 to 80 nm thick silicon film containing an n-type impurity with a concentration of about $3 \times 10^{18}$ atoms/cm³ is then formed thereon.

Ion implantation and activation annealing are then performed so as to dope the surface region of the emitter layer 118 with an n-type impurity to a high concentration (for example in the range from $1 \times 10^{20}$ atoms/cm³ to the solid solubility level) thereby forming an emitter contact layer 119. The activation annealing should be performed in the range from about 850° C. to 900° C. A base and an emitter on the base are then formed by means of a patterning technique.

Subsequently, as shown in FIG. 1C, an interlayer insulating film 121 is formed and then contact holes 122, 123, and 124 are formed in the interlayer insulating film 121. Electrodes 125, 126, and 127 are then formed such that these electrodes are in contact with the base layer 117, the emitter contact layer 119, and the collector contact diffusion layer 116, respectively, through the contact holes 122, 123, and 124.

In another (second) conventional technique, the base layer, the emitter layer, and the emitter contact layer are formed by means of a low-temperature epitaxial growth process.

In a still another (third) conventional technique, after epitaxially forming the base layer and the emitter layer, an n-type impurity region is formed by means of an ion implantation process.

In the first conventional technique, however, if the base layer is subjected to a heat treatment at a temperature higher than approximately 800° C., diffusion of boron (B) and germanium (Ge) in the base layer occurs. If such a diffusion occurs, the base width will be expanded and discrepancy in position between the bandgap profile and the p-n junction will occur. Furthermore, since the base layer of silicon germanium (SiGe) has a thickness greater than the critical film thickness determined by the thermal equilibrium theory, the high-temperature heat treatment will introduce dislocations, which will result in a degradation in transistor performance.

As shown in FIG. 2, immediately after the formation of the base layer by means of the epitaxial growth technique, it has a boron concentration distribution limited within a narrow range represented by a broken line, which is coincident with the range of the silicon germanium mixed crystal. However, boron atoms (B) diffuse during heat treatment performed after the formation of the base layer. As a result, the boron distribution is spread as represented by a solid line. Thus, the heat treatment causes an increase in the base width, which makes it difficult to achieve a high-speed operation. In FIG. 2, the vertical axis represents the impurity concentration, and the horizontal axis represents the depth across the emitter, the base, and the collector.

In the second example of the conventional technique described above, when the epitaxial growth is performed at a low temperature below 800° C., the surface of silicon becomes chemically more inactive due to adsorption of group V elements with the increase in the concentration of n-type impurity contained in the [ambient] in which the epitaxial growth is performed. This leads to a great reduction in the growth rate to a level which is too low for practical production.

On the other hand, in the third conventional technique, heat treatment at a rather high temperature is required to activate the implanted ions and to remove damage induced in the crystal during the ion implantation process. During the crystal annealing process, interstitial silicon atoms are generated, which can result in an increase in the diffusivity of boron (B) by two or more orders of magnitude.

The generation of interstitial silicon atoms in the ion implantation process is also a problem when an emitter is formed of polysilicon. If in-situ doped polysilicon is employed, the problem of enhanced diffusion of boron (B) due to the generation of interstitial silicon can be avoided. However, it is difficult to grow polysilicon on silicon without having a native oxide layer at the interface between the silicon and the polysilicon. The formation of the native oxide results in an increase in the emitter resistance.

Furthermore, when a bipolar transistor having a shallow base layer is formed together with another type of device such as a MOS transistor on the same substrate if polysilicon is employed to form the gate electrode of the MOS transistor, and the emitter, base and collector electrodes of the bipolar transistor as well as a resistor element, the polysilicon is required to be doped with an impurity to a high enough concentration, and the impurity atoms have to be activated by high-temperature heat treatment.

However, the impurities incorporated into the Si and SiGe films can diffuse during the high-temperature heat treatment. Thus, even if the above thin films are formed by means of the epitaxial technique, the high-temperature heat treatment leads to chances in the impurity profiles. Thus the effective thicknesses of the films become different from their original thicknesses.

When an SiGe film is employed as the base layer, since the lattice constant of Ge is 4% greater than that of Si, an internal stress occurs at the interface between the Si substrate and the SiGe film formed on the Si substrate. Therefore, if heat treatment is performed after forming the SiGe film on the Si substrate, a plastic strain occurs in the SiGe film so that the above internal stress is relaxed. As a result, lattice defects are created in the SiGe film. Since the above internal stress increases with increasing the Ge content, the sensitivity to the heat treatment decreases with the increasing Ge content.

On the other hand, the bandgap decreases with the increasing Ge content and having the alloy under stress with respect to the underlying silicon. It is advantageous to preserve the stress in the film and incorporate the proper amount of Ge into the alloy in order to create the correct heterojunction.

As can be understood from the above discussion, the advantages of the shallow base layer (of SiGe or Si) formed by means of the epitaxial technique are lost by the heat treatment performed on the substrate after the formation of the shallow base layer.

It is an object of this invention to provide a method and device that overcomes most of the limitations of prior art devices and processes for fabrication of these devices. It is a further object of this invention to provide a transistor having a SiGe layer deposited over a substrate of silicon wherein the SiGe layer does not require further doping after a covering polysilicon layer is applied thereto.

It is a further object of the invention to provide a multi-layered semiconductor device having a layer of SiGe wherein after the application of SiGe to a substrate of another type of material, the SiGe layer about a base region remains substantially unchanged in thickness and conductivity.

SUMMARY OF THE INVENTION

In accordance with the invention, a method of forming a semiconductor structure is provided comprising the steps of:
 a) providing a semiconductor substrate;
 b) providing a layer of SiGe over at least a region of the semiconductor substrate;
 c) providing a mesa of over a portion of the SiGe layer;
 d) depositing a polycrystalline silicon layer over the mesa and over lower adjacent regions of the SiGe layer;
 e) planarizing the polycrystalline silicon layer to expose the mesa; and,
 f) etching the mesa to expose a region of SiGe below.

In accordance with the invention method of forming a semiconductor structure is provided comprising the steps of:
 a) providing a substrate of a first semiconductor type;
 b) providing a second layer of a second type of semiconductor material over at least a region of the first semiconductor substrate;
 c) providing a mesa of over a portion of the second layer, the mesa being a material that can bond to the second type of semiconductor and that can be etched by an etching source without etching the second type of semiconductor;

d) depositing a conductive layer over the mesa and over lower regions adjacent to the mesa that will not be etched by the etching source;

e) planarizing the conductive layer; and, f) etching the mesa to expose a region of the second layer below.

In accordance with the invention there is further provided, a method of forming a semiconductor structure comprising the steps of:

a) providing a semiconductor substrate;

b) providing a layer of SiGe over at least a region of the semiconductor substrate;

c) providing a mesa over a portion of the SiGe layer;

d) depositing a polycrystalline silicon layer over the mesa and over lower adjacent regions of the SiGe layer;

e) exposing an upper surface of the mesa by removing the polycrystalline silicon layer over the mesa;

f) and removing the mesa to expose a region of SiGe below.

In accordance with another aspect of the invention, a semiconductor device is provided, comprising:

a silicon substrate forming one of a collector and an emitter, the substrate being of a first conductivity type;

a layer of SiGe of a second conductivity type covering at least a portion of the silicon substrate; and, a first layer of polysilicon of the second conductivity type at least substantially supported by and covering a substantial portion of the SiGe layer with the exception of a window region, forming a SiGe base of the transistor; and, a second layer of polysilicon of the first conductivity type covering and contacting the SiGe base of the transistor said layer of polysilicon forming the other of the collector and the emitter.

In accordance with another aspect of the invention, a semiconductor device is provided, comprising:

a silicon layer of a first conductivity type;

a layer of SiGe of a second conductivity type covering at least a region of the silicon layer; and, a first layer of polysilicon of the second conductivity type at least substantially supported by and covering a substantial portion of the SiGe layer with the exception of a small window; and, a second layer of polysilicon of the first conductivity type covering the window and contacting the SiGe layer.

In accordance with a different aspect of the invention, a method is provided of applying a semiconductor seed layer to a mixed topology substrate having regions of exposed semiconductor material and regions of exposed dielectric material, comprising the steps of:

disposing the substrate in a growth chamber and nucleating the seed layer by exposing the semiconductor material and dielectric material to an atmosphere of gases, the gases being presented at a predetermined flow rate, temperature and pressure, wherein the temperature is less than 600° C., the pressure is less than $10^{-2}$ mbar, and the flow rate is less than 5 sccm.

An embodiment of the invention further comprises the step of providing a multi-layered semiconductor device having a layer of SiGe wherein after the application of SiGe to a substrate of another type of material, the SiGe layer about a base region remains substantially unchanged in thickness and conductivity; alternatively, boron is prescribed in the profile in the base for diffusion into the profile we require to get the best transistor performance.

BRIEF DESCRIPTION OF THE DRAWINGS

Exemplary embodiments of the invention will now be described in conjunction with the drawings in which:

More particularly FIG. 3 illustrates a portion of a pretreated silicon wafer in condition to accept a layer of SiGe and a layer of Si in a region for forming a transistor;

FIG. 4 is an illustration showing a layer of SiGe and Si supported by the substrate;

FIG. 5 is a more detailed view of the region of interest wherein portions of the SiGe/Si shown in FIG. 4 have been etched away;

FIG. 6 is a detailed view of a mesa that has been created overtop of the SiGe/Si layers;

FIG. 7 is a detailed illustration of the mesa shown in FIG. 6, wherein a layer of oxide is deposited thereon;

FIG. 8 is a detailed side view of as shown in FIG. 7 wherein a layer of polycrystalline silicon has been deposited and after the upper surface is polished to a planar surface;

FIG. 9 is an illustration of uppers layers of the device after the polycrystalline silicon has been oxidized and the mesa has been removed by etching;

FIG. 10 is an illustration of the layers after the mesa has been removed;

FIGS. 11 through 13 illustrate the completion steps required to form an active device; and, FIGS. 14 through 24 illustrate views of a transistor in various states of manufacture, to its completion.

DETAILED DESCRIPTION

FIGS. 3 through 13 illustrate sequential steps in the formation of a bipolar junction transistor starting with a silicon wafer. FIGS. 14 through 24 illustrate same sequential steps for the formation of a BJT wherein the layers formed are planar.

Figure 1A:
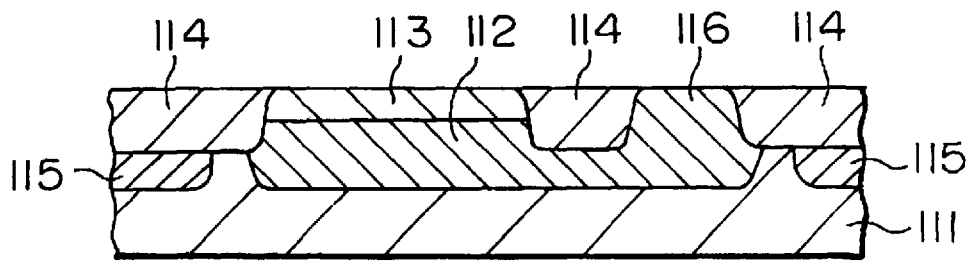
FIGS. 1A–1C is a schematic representation of the processing steps of producing a semiconductor device according to a conventional technique.
Figure 1B:
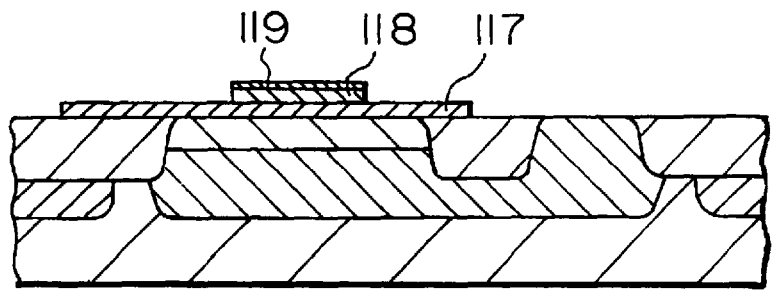
Figure 1C:
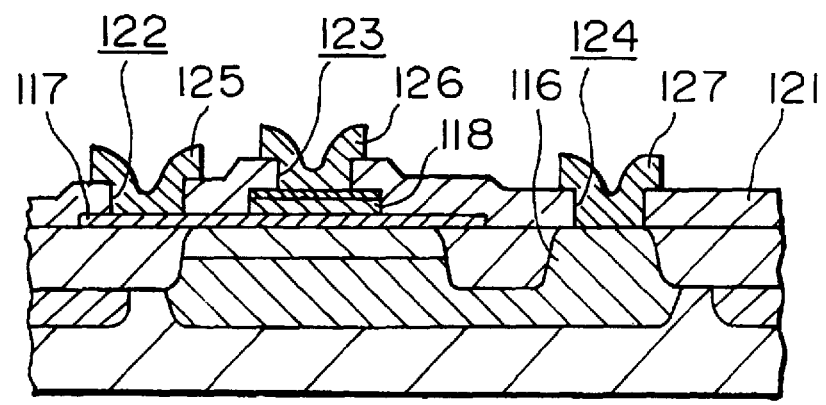
Figure 2:
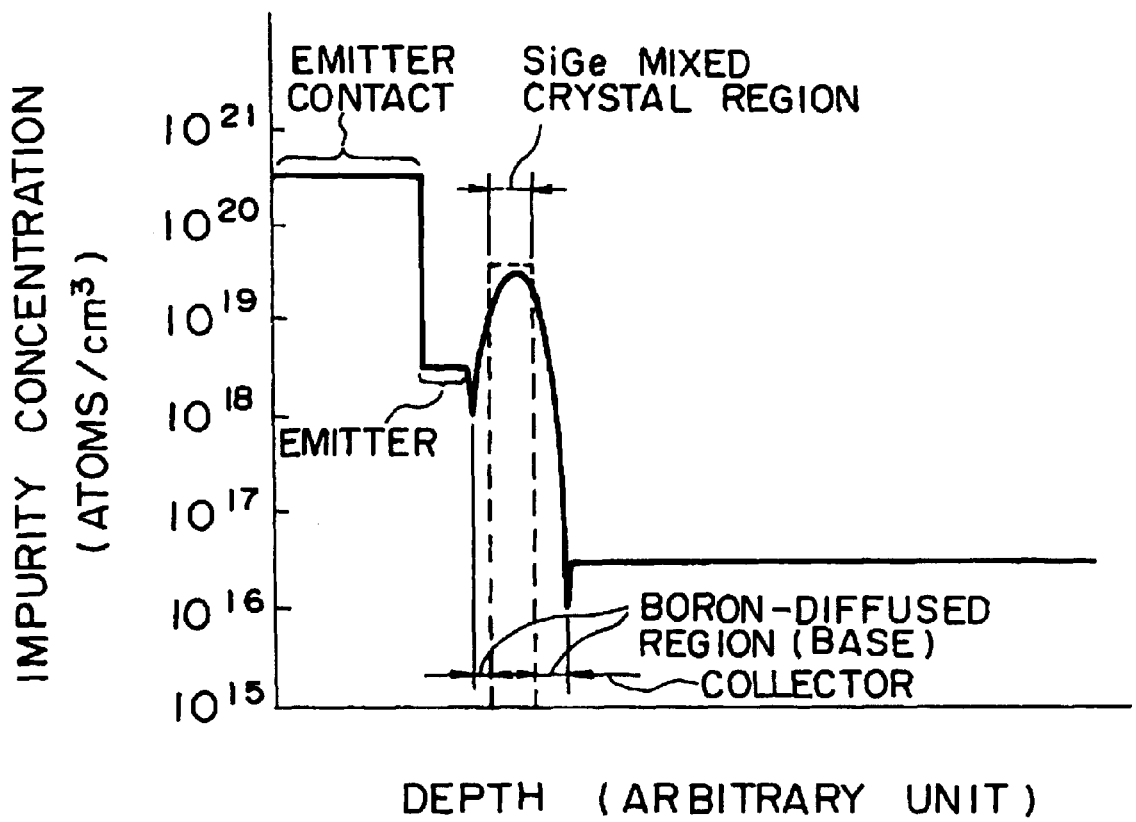
FIG. 2 is a graph illustrating an impurity profile.
Figure 3A:
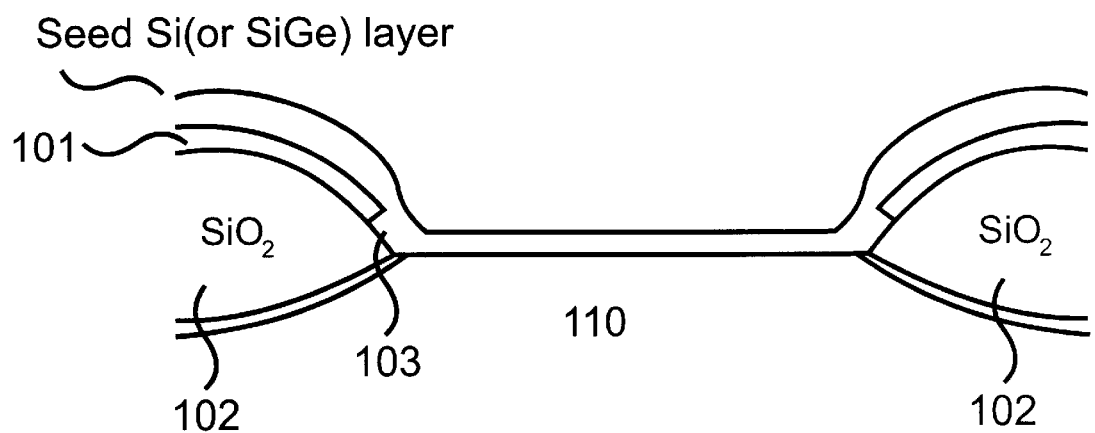
FIGS. 3a and 3b illustrate the process of depositing a nucleation layer in accordance with an aspect of this invention.
Figure 3B:
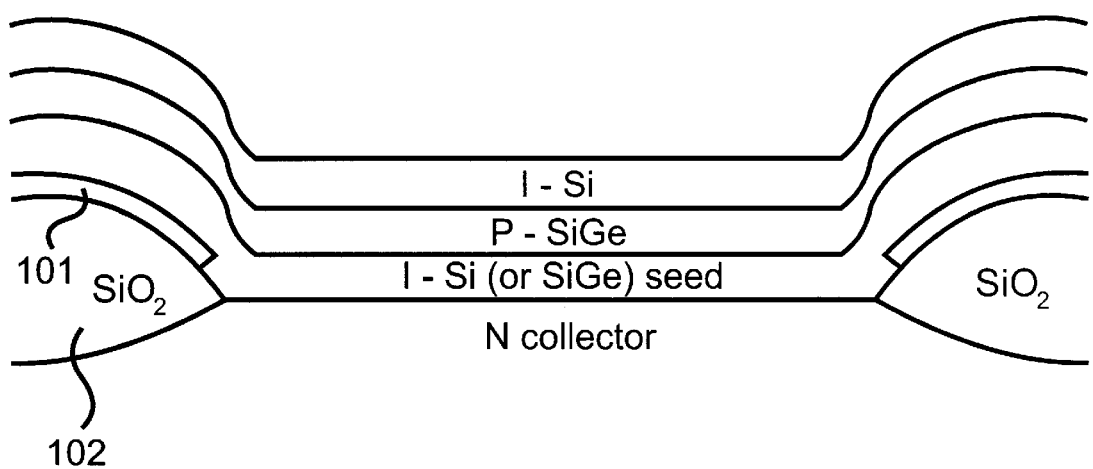
Figure 3C:
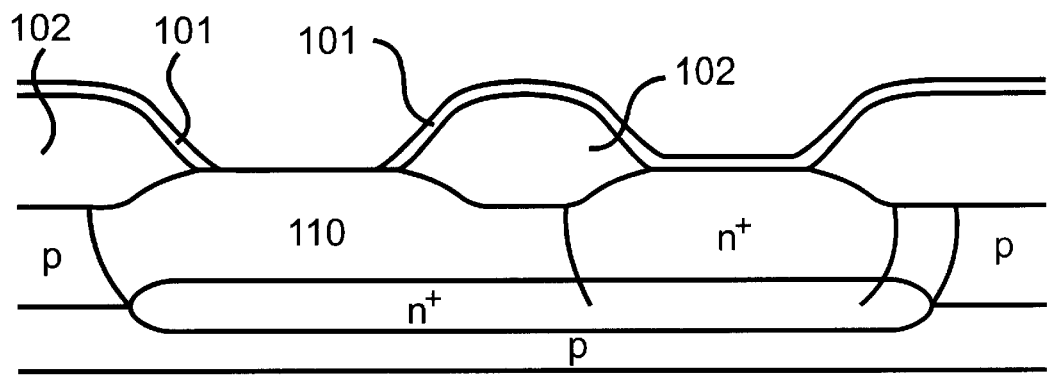
FIGS. 3 through 13 are cross-sectional views of schematic representations of a structure illustrating various process to produce a "double poly" SiGe heterojunction bipolar transistor (HBT) in accordance with this invention.

In FIG. 3 a silicon wafer is shown, serving as both a substrate 110 and collector of a bipolar junction transistor. The silicon substrate 110 has a region of $n^+$ doped material buried within the substrate providing as a low resistance sub-collector. The following process steps will illustrate the formation of a base and emitter, wherein the base of the transistor is grown over a region of the substrate 110. Regions 102 of field oxide $SiO_2$ are disposed over the silicon, providing insulating regions. A thin 100–800 Å layer 101 of poly-silicon is deposited over a portion of the field oxide regions 102 and over a small region of the window of silicon 110 between the two field oxide regions 102 shown, which serve as a sacrificial material to minimize loading effects and which minimize the effect of moisture within $SiO_2$ regions 102. The thin poly-silicon layer 101 also provides a surface upon which a layer of SiGe will adhere, and forms an electrical contact to the SiGe layer.

Figure 4:
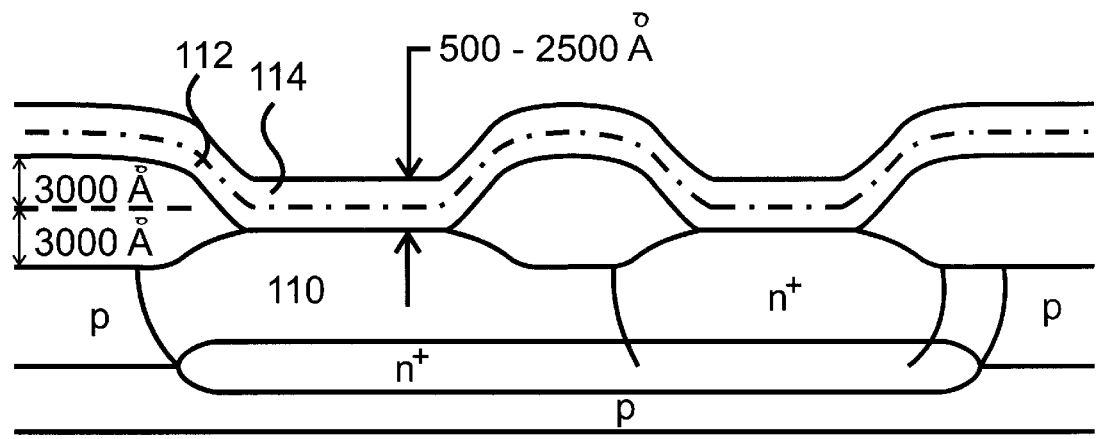
Figure 5:
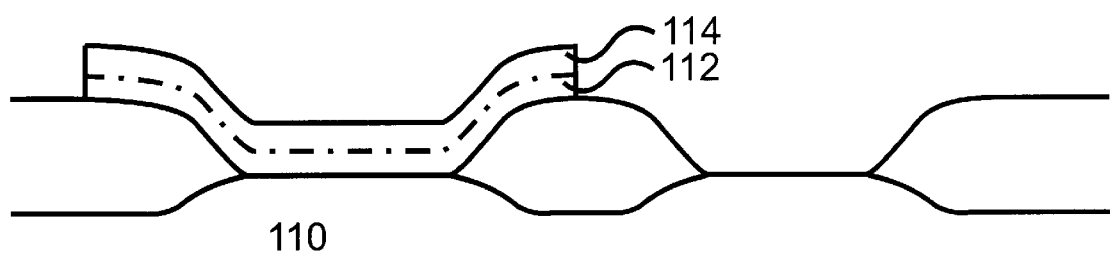
Figure 6:
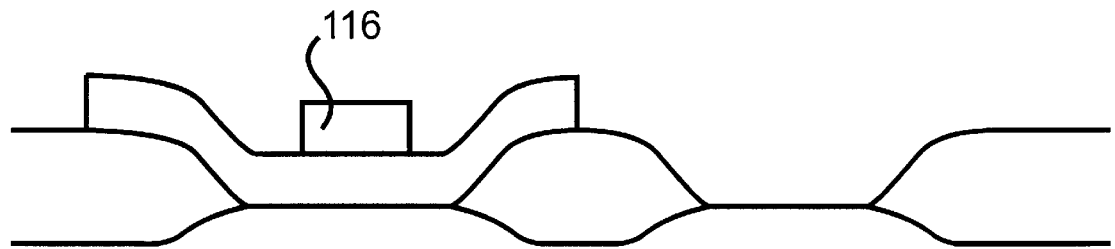

Turning now to FIG. 4, a layer 112 of p-type SiGe is first deposited over the n-type silicon substrate 110 and a layer 114 of intrinsic Si is grown over the SiGe layer 112. The SiGe layer 112 is pre-doped and is not implanted with p-type ions after it is deposited over the substrate. The layers 112 and 114 form the base and emitter-seat of the transistor, respectively, and have a combined thickness between 500 and 2500 Å. It is preferred that the layer 112 of SiGe grown over the silicon substrate 110 be uniform over a "window" of interest between the field oxide regions 102, that will form the p-type base of the BJT. FIG. 5 illustrates the surface after unwanted SiGe/Si material in particular regions is etched away leaving SiGe and Si only in desired location. A layer of a suitable material such as $SiO_xN_y$, more specifically $SiO_2$ or preferably $Si_3N_4$, for forming an etchable mesa 116 is subsequently deposited over top of SiGe/Si resultant layers 112 and 114 to form a mesa or pedestal, that will itself later be etched away without etching the underlying SiGe/Si layers 112 and 114, as illustrated in FIG. 6. It is important that the SiGe/Si layers 112 and 114 not be inadvertently etched since the p-type dopant is already positioned within the layer 112 grown on the silicon substrate 110; this is in contrast to prior art techniques where an ion implanter is used to dope the base region of the transistor with p-type dopant. Thus, if some of the SiGe/Si layers were inadvertently etched, the overall thickness and/or the uniformity of the thickness of the SiGe layer will be varied, altering the transistor's electrical characteristics. Of course it is desired to have uniformity across the transistor base layer. It is required that the mesa is composed of a material which can be etched selectively from the underlying SiGe/Si and the oxide sidewalls. Reactive ion etching may also be required after depositing the mesa 116 in order to confine it to a region of a desired size to temporarily mask an emitter window. Although the maximum height of this mesa is not restricted, it is preferable to be approximately 2000 Å or of a height that is at least coincident of a thickness of a layer of Si-poly that will subsequently be deposited adjacent thereto.

Figure 7:
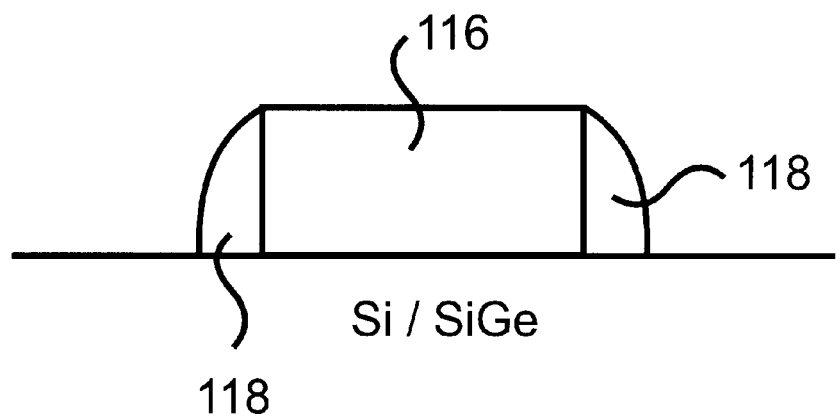

In FIG. 7 an oxide 118 of $SiO_2$ is shown placed on the sidewalls of the $Si_3N_4$ mesa 116 having a thickness at its base in the range of 1000–3000 Å which serves as an insulating layer.

In the following process step, depicted in FIG. 8, a layer 120 of $p^+$ silicon poly (polycrystalline silicon) is deposited entirely over the $Si_3N_4$ mesa 116 and the $SiO_2$ sidewall oxide 118.

Figure 8:
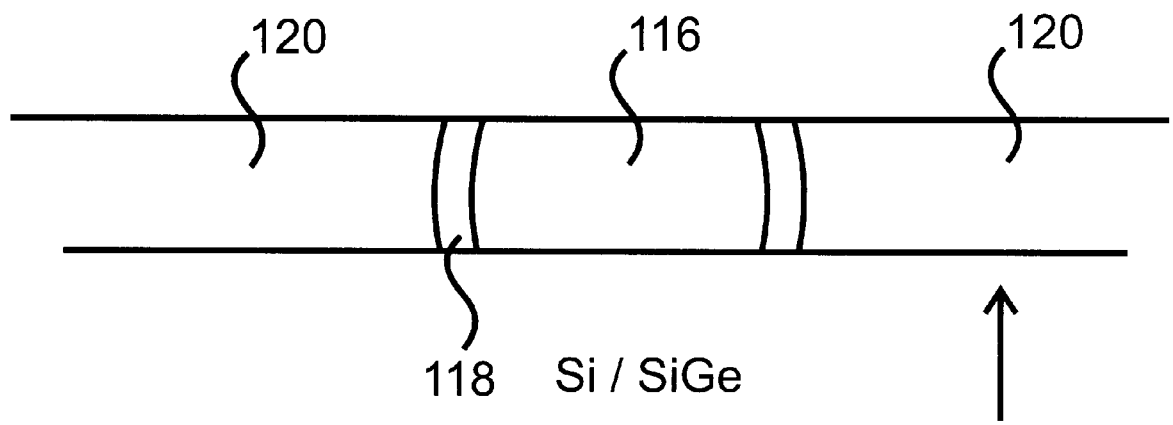

FIG. 8 illustrates the layer structure after etching back, preferably by polishing to a thickness of a approximately 500 Å and to provide a planar surface.

Figure 9:
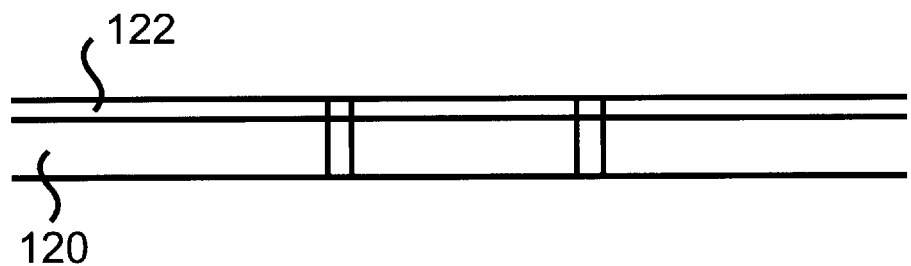
Figure 10:
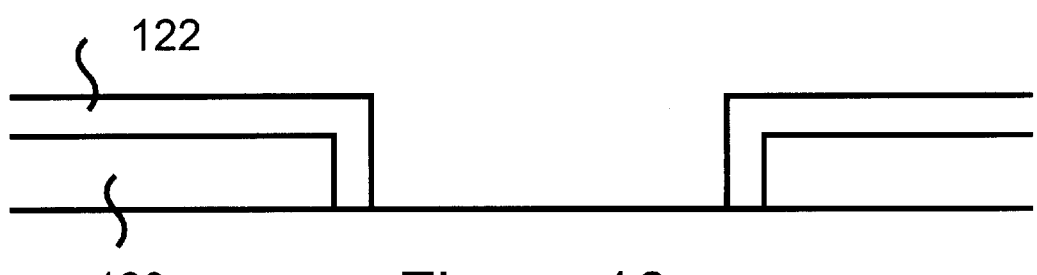

FIGS. 9 and 10 illustrate two subsequent process steps, whereby a $SiO_2$ layer 122 is formed over the layer 120 of $p^+$ polycrystalline silicon followed by the removal of the $Si_3N_4$ mesa 116 to expose the window of SiGe/Si. Of course it is necessary to ensure the layers 112 and 114 of SiGe/Si below the mesa 116 are not etched as their thickness should be uniform and preserved so that its electrical characteristics are not changed.

Figure 11:
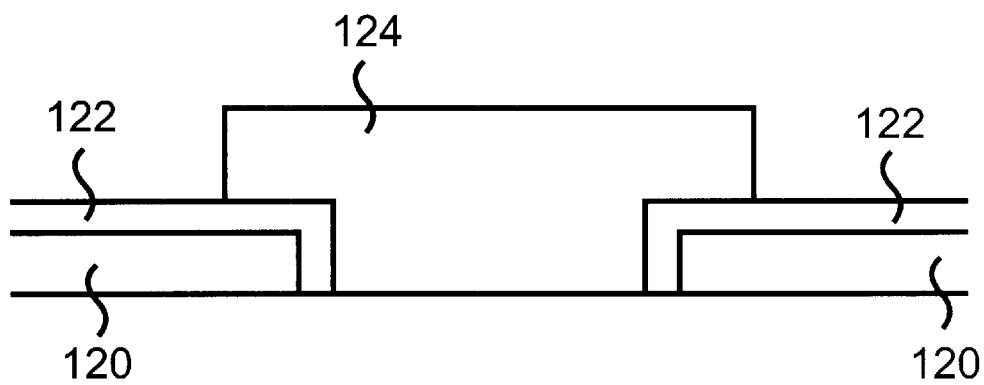

In FIG. 11 the window is filled with a poly Si layer 124 which can be doped during deposition or ion-implanted to make it n-type. This layer forms the emitter of the transistor. Later, in the presence of a suitable amount of heat, some of the n-type dopant in the emitter diffuses in to the Si/SiGe layers 112 and 114 to form an n-type region near the p-type SiGe base. This is the emitter-base junction and, of course, it is positioned accordingly with respect to the Ge profile. The combination of the proper p-n junction with the changing energy bandgap provides a suitable heterojunction.

Figure 12:
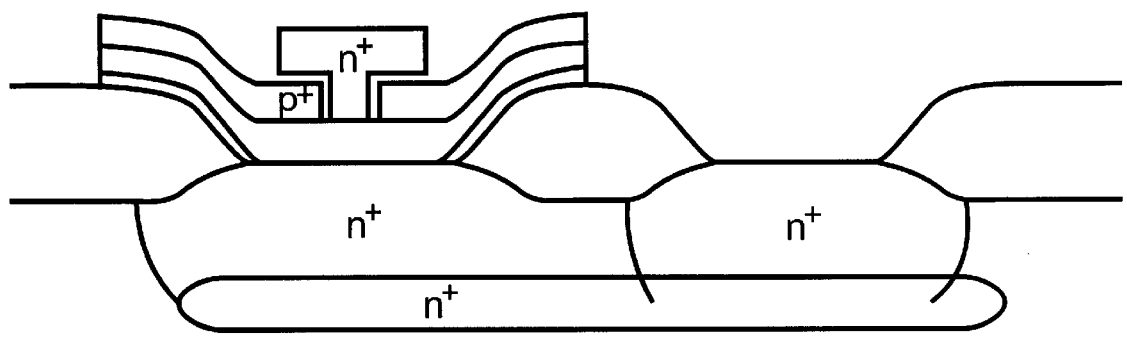
Figure 13:
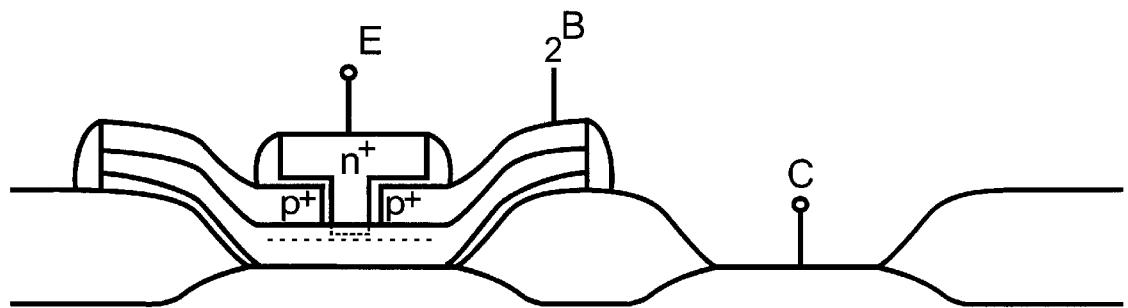
Figure 14:
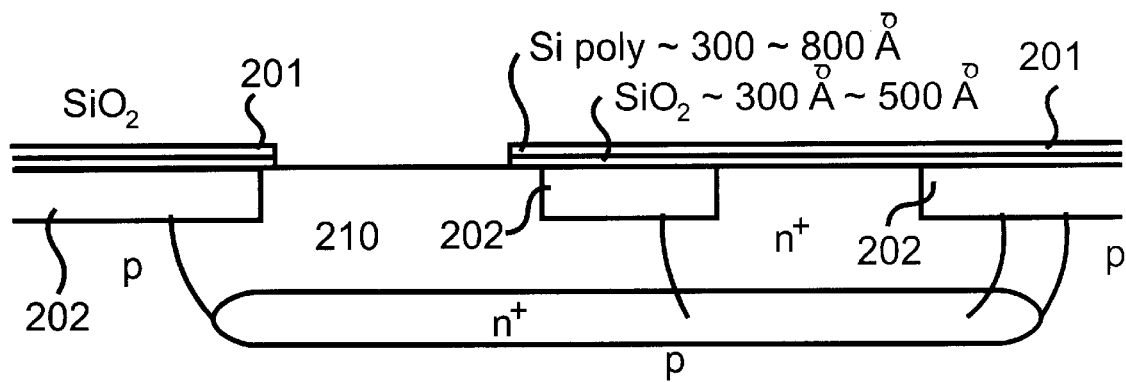
Figure 15:
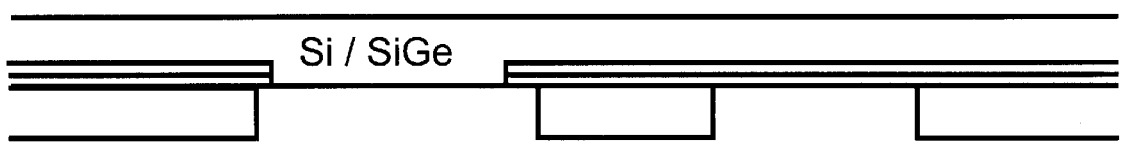
Figure 16:
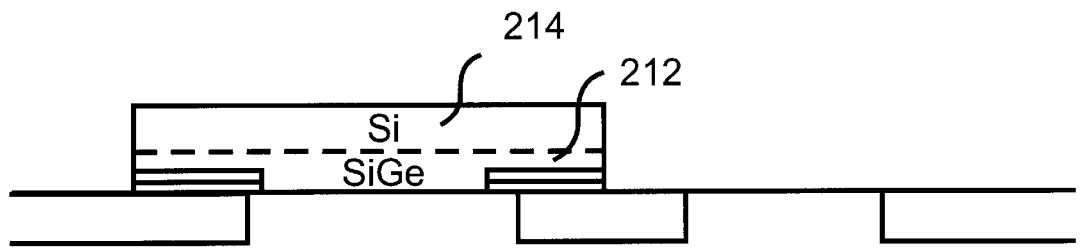
Figure 17:
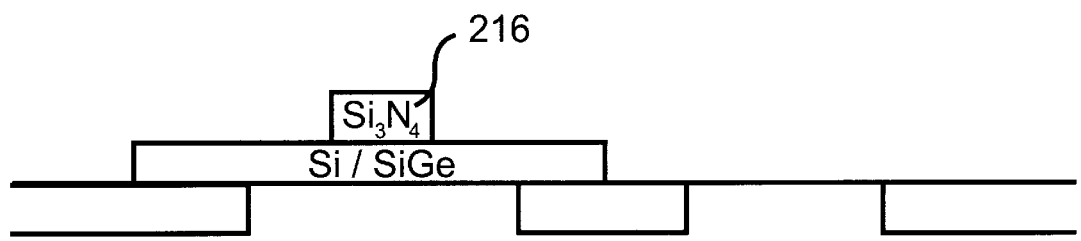
Figure 18:
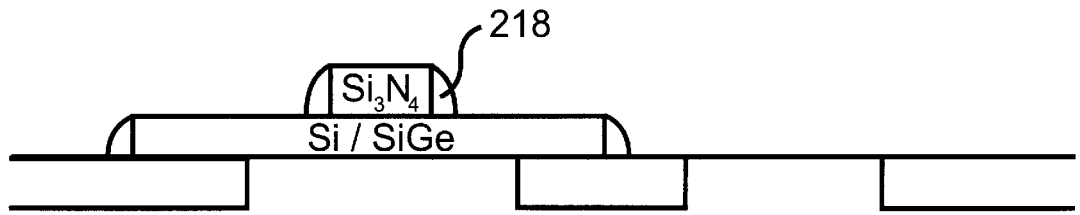
Figure 19:
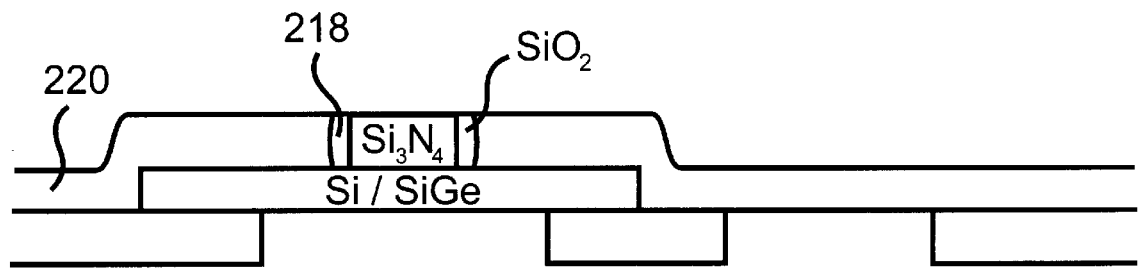
Figure 20:
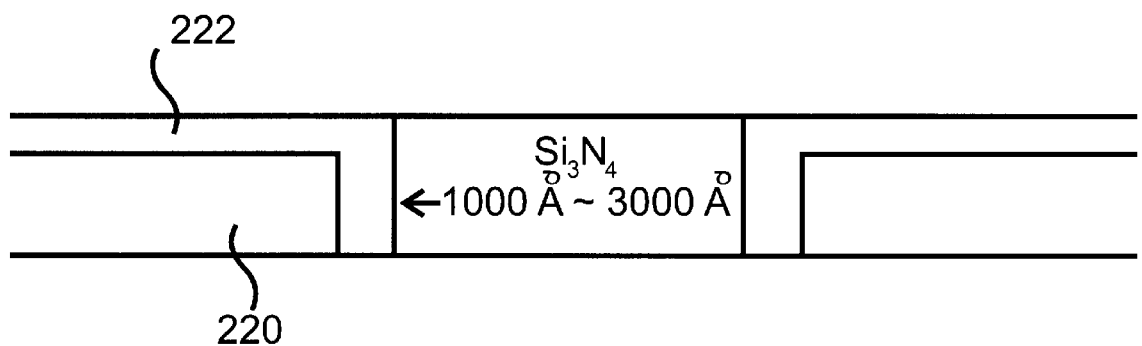
Figure 21:
Figure 22:
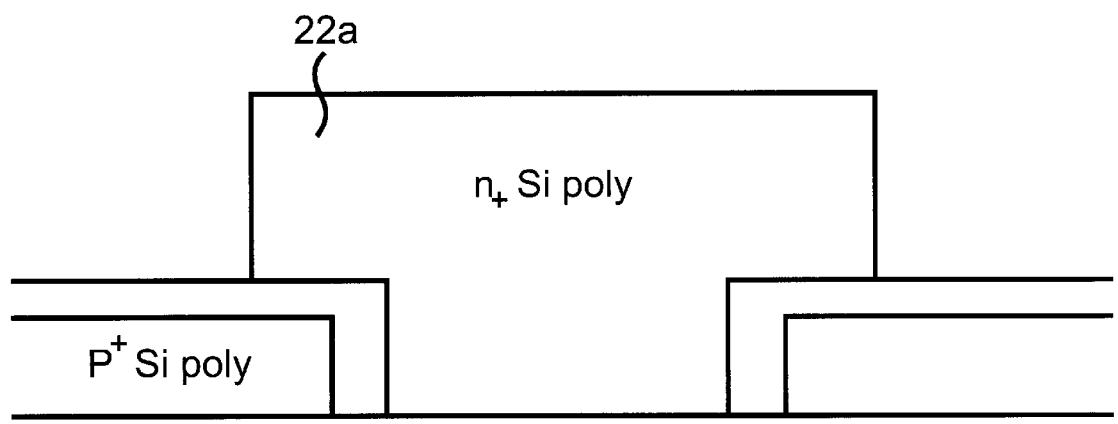
Figure 23:
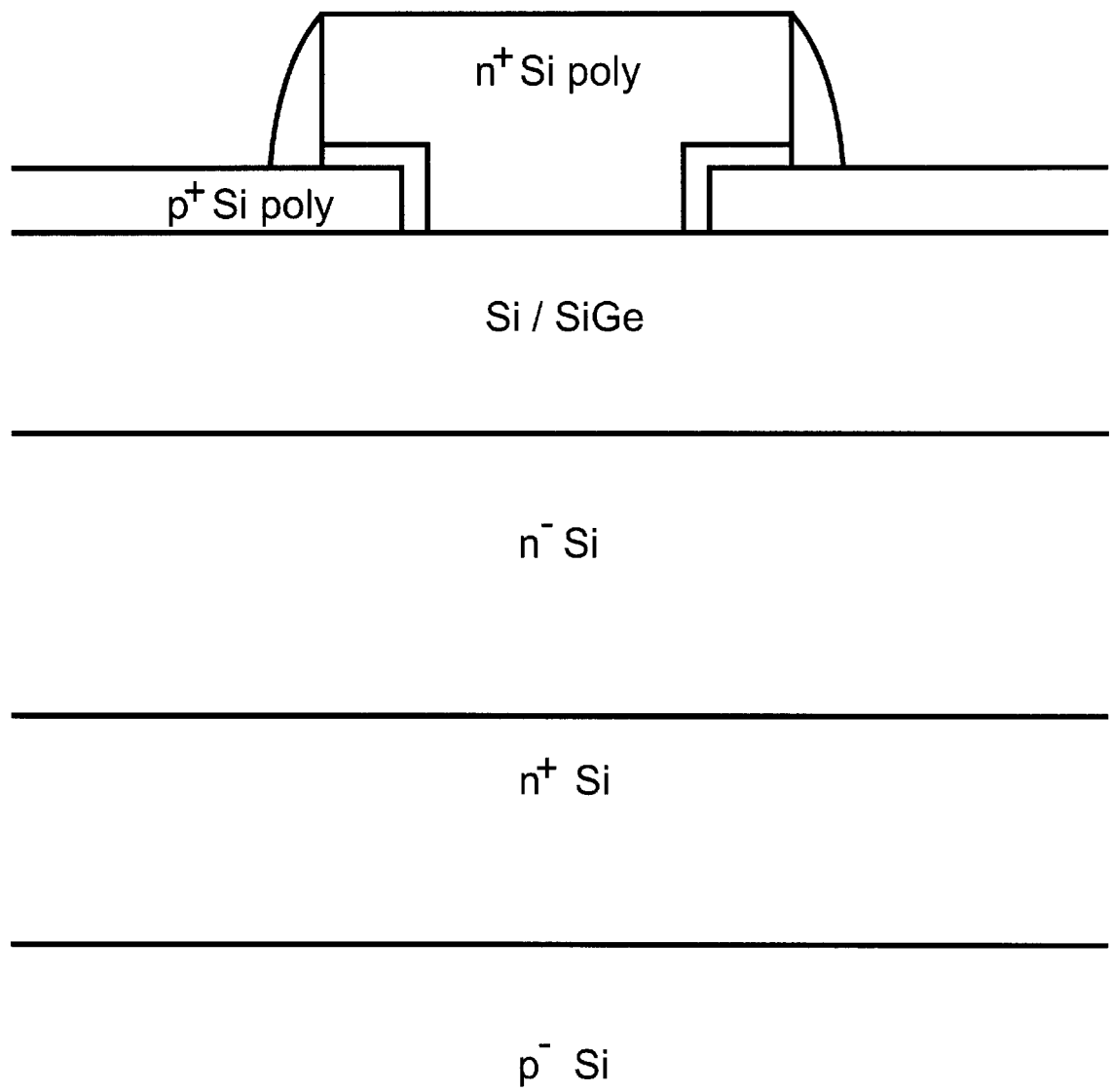
Figure 24:
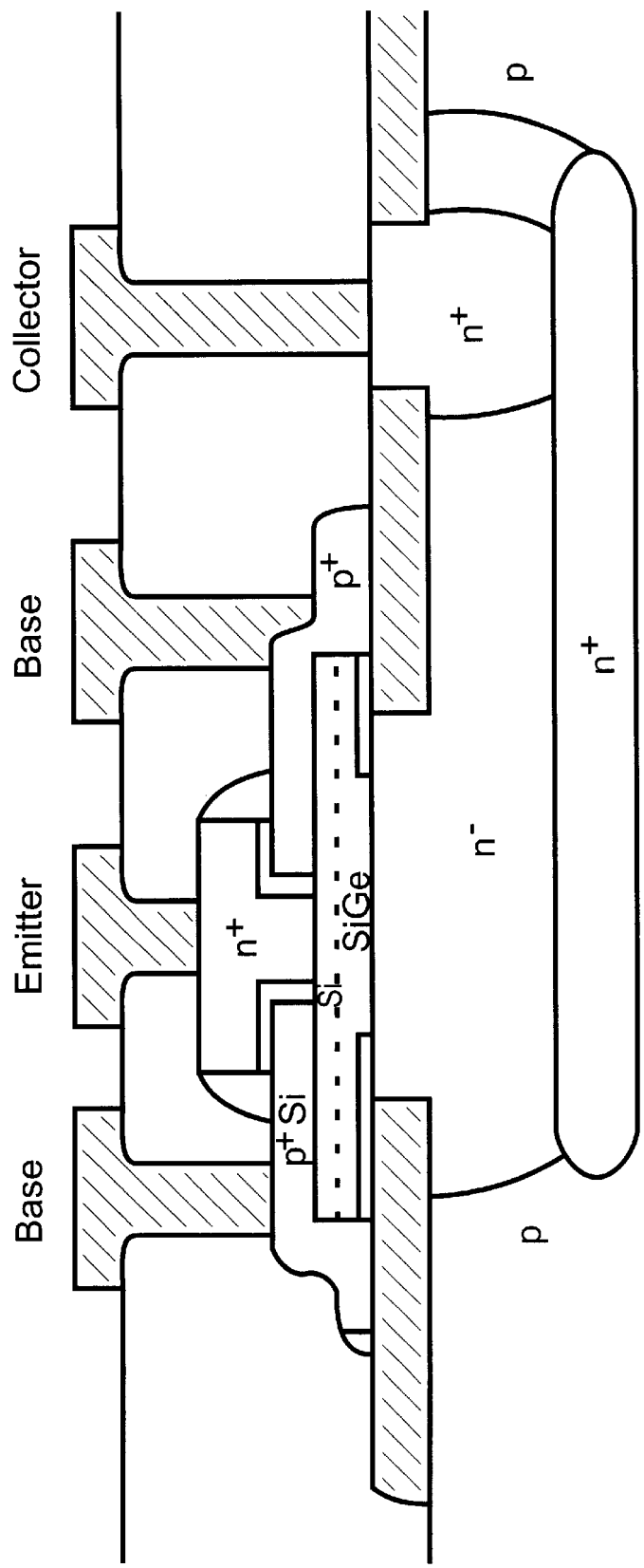

Referring now to FIG. 12 and FIG. 13, an oxide is deposited on the sidewalls to create sidewalls which further isolate n-type and p-type poly areas.

Turning now to FIGS. 14 through 24, substantially same process steps are employed in the manufacture of a BJT having a more planar topology. Elements 201, 202, 210, 212, 214, 216, 218, 220, 222 and 224 are shown which are similar to elements 101, 102, 110, 112, 114, 116, 118, 120, 122 and 124, respectively, in FIGS. 1 through 13.

An essential step in a manufacturable epitaxial process is the reproducible deposition of epitaxial silicon and/or SiGe on a mixed topography i.e. single crystal silicon, poly Si, and oxide (or nitride) of variable roughness. This invention discloses a method for deposition of a seed layer atop the collector region to form a planar surface and a thin uniform thickness, continuous interconnecting silicon or silicon germanium layer without pinholes and defect free. Turning now to FIGS. 3a and 3b a preferred embodiment of the invention is shown wherein a nucleation seed layer of Si or SiGe is applied over a mixed topology of layers shown, comprising poly-silicon 101, a section 103 of the region 102 of $SiO_2$, and the silicon substrate 110. This is accomplished at ultra low pressure and ultra-low flow rates to provide adequate time for nucleation of the deposited layer on all surfaces; oxide, nitride, polysilicon, epitaxial silicon and SiGe. Smooth deposited layers of uniform thickness with continuous coverage of all surfaces is possible using this method. In order to have the continuous film or seed layer deposit and nucleate over the entire region of the dissimilar materials such as dielectric material and semiconductor material, it is important to meet several conditions. Deposition must be performed at a low temperature below 600° C., a low pressure of less than $10^{-2}$ mbar, and at low flow rate of less than 5 cm$^3$/min. Another advantage to this method, is that in a mixed topography wherein relatively different sized Si and oxide regions exist, by depositing a seed layer in accordance with the teachings of this invention over top of these regions, at low temperature, pressure and flow rate, loading effects are substantially minimized when the SiGe layer is deposited upon the seed layer. Seed layers have been discussed in the prior art, however these layers have not achieved a desired effect of nucleating a continuous film over a large region of dissimilar materials including dielectrics and semiconductors. Furthermore, prior art seed layers are applied at higher temperatures, flow rates and pressure than are taught in this invention in order to increase the throughput. Surprisingly, it was discovered by the inventors of this invention, that lowering the temperature, pressure and flow rate allowed nucleation that would not otherwise occur. Without the seed layer no deposition on oxide or nitride surfaces is possible thereby resulting in a discontinuous film of silicon or SiGe over mixed surface topography which would substantially increase $R_b$. Planarization of the prior surfaces reduces roughness and removes prior process deficiencies. Residual patches of silicon dioxide or carbon-containing material on the exposed silicon window surface can result in defects during post epitaxy processing by injecting dislocations and other defects such as stacking faults. The seed layer drastically reduces this tendency by introducing a planar surface coverage thereby removing the stress concentration at any heterogeneity in the interface and at discontinuities in the surface, for example silicon/silicon dioxide/poly silicon.

The method of providing the seed layer will now be described in accordance with a preferred embodiment of the invention. Prior to introduction into the UHVCVD system all surfaces of the wafer are cleaned using standard RCA* cleaning procedures and dipped to hydrophobicity in a 10:1 diluted HF:H$_2$O to ensure removal of contamination debris from processing and residual native oxide from silicon rich surfaces. The UHVCVD system and its operation are described elsewhere*. Immediately on insertion of the wafers into the growth chamber under a flow of preferably less than 500 sccm of hydrogen, silane at the reduced flow rate of less than 20 sccm is injected into the deposition chamber to initiate the nucleation of silicon and produce the seed layer on all exposed surfaces. The seed layer has a thickness for conformal nucleation of Si from silane. Preferably, the thickness of the "nucleation layer" is a minimum of 2 nm and is optimized for a specific mixed topography in the range of 2 to 20 nm is and can be doped or undoped with impurities such as B or P, p- or n-type.

What is claimed is:

1. A method of forming a semiconductor structure comprising the steps of:
   a) providing a semiconductor substrate;
   b) providing a layer of SiGe over at least a region of the semiconductor substrate;
   c) providing a mesa of over a portion of the SiGe layer;
   d) depositing a polycrystalline silicon layer over the mesa and over lower adjacent to regions of the SiGe layer;
   e) planarizing the polycrystalline silicon layer to expose the mesa and,
   f) etching the mesa to expose a region of SiGe below.

2. A method as defined in claim 1, wherein the mesa is a SiO$_x$N$_y$, material.

3. A method as defined in claim 1, wherein step (e) is performed by polishing the polycrystalline silicon layer.

4. A method as defined in claim 3, wherein the polishing is performed to expose a surface of the mesa.

5. A method as defined in claim 1, wherein the step of etching etches away the mesa while substantially preserving the adjacent polysilicon SiGe layers.

6. A method of forming a semiconductor structure comprising the steps of:
   a) providing a semiconductor substrate;
   b) providing a layer of SiGe over at least a region of the semiconductor substrate;
   c) providing a mesa over a portion of the SiGe layer;
   d) depositing a polycrystalline silicon layer over the mesa and over lower adjacent regions of the SiGe layer;
   e) exposing an upper surface of the mesa by removing the polycrystalline silicon layer over the mesa; and,
   f) removing the mesa to expose a region of SiGe below.

7. A method as defined in claim 6, wherein the mesa is removed by an etching process.

8. A method of applying a semiconductor seed layer to a mixed topography substrate having regions of exposed semiconductor material and regions of exposed dielectric material, comprising the steps of:

disposing the substrate in a growth chamber and nucleating the seed layer by exposing the semiconductor material and dielectric material to an atmosphere of gases, the gases being presented at a predetermined flow rate, temperature and pressure, wherein the temperature is less than 600° C., the pressure is less than 10$^{-2}$ mbar, and the flow rate is less than 5 sccm.

9. A method as defined in claim 8 further comprising the step of cleaning surfaces of the substrate for removal of contamination and debris.

10. A method as defined in claim 8 wherein at least one of the gases is hydrogen and has a flow rate of less than 500 sccm and wherein another of the oases is silane and has a reduced flow rate of less than 20 sccm and wherein said oases are injected into the deposition chamber to initiate the nucleation of silicon and produce the seed layer on all exposed surfaces.

11. A method as defined in claim 8, wherein the seed layer is deposited to have a thickness of between 2 to 20 nm.

12. A method as defined in claim 8 wherein the seed layer is doped with impurities.

* * * * *